United States Patent
Zellner et al.

(10) Patent No.: US 9,304,408 B2
(45) Date of Patent: Apr. 5, 2016

(54) PROJECTION OBJECTIVE FOR MICROLITHOGRAPHY

(71) Applicant: Carl Zeiss SMT GmbH, Oberkochen (DE)

(72) Inventors: Johannes Zellner, Aalen (DE); Hans-Juergen Mann, Oberkochen (DE); Martin Endres, Koenigsbronn (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 14/104,211

(22) Filed: Dec. 12, 2013

(65) Prior Publication Data
US 2014/0104588 A1    Apr. 17, 2014

Related U.S. Application Data

(63) Continuation of application No. 12/884,670, filed on Sep. 17, 2010, now Pat. No. 8,629,972, which is a continuation of application No. PCT/EP2009/001448, filed on Feb. 28, 2009.

(30) Foreign Application Priority Data

Mar. 20, 2008  (DE) .......................... 10 2008 000 800
Jul. 16, 2008   (DE) .......................... 10 2008 033 342

(51) Int. Cl.
*G03B 27/32*   (2006.01)
*G03B 27/54*   (2006.01)
(Continued)

(52) U.S. Cl.
CPC ........ *G03F 7/70316* (2013.01); *G02B 17/0663* (2013.01); *G03F 7/702* (2013.01); *G03F 7/70233* (2013.01)

(58) Field of Classification Search
CPC .................. G03F 7/70058–7/70208; G03F 7/70216–7/70241
USPC ................................ 355/67, 71, 77
See application file for complete search history.

(56) References Cited

U.S. PATENT DOCUMENTS

| 6,072,852 A | 6/2000 | Hudyma |
| 6,266,389 B1 | 7/2001 | Murayama et al. |

(Continued)

FOREIGN PATENT DOCUMENTS

| CN | 1445613 A | 10/2003 |
| CN | 101 263 430 A | 9/2008 |

(Continued)

OTHER PUBLICATIONS

Extended European Search Report for corresponding EP Appl No. 12 178 143.9, dated Nov. 9, 2012.
(Continued)

*Primary Examiner* — Colin Kreutzer
(74) *Attorney, Agent, or Firm* — Fish & Richardson P.C.

(57) ABSTRACT

A projection objective for microlithography is used for imaging an object field in an object plane into an image field in an image plane. The projection objective comprises at least six mirrors of which at least one mirror has a freeform reflecting surface. The ratio between an overall length (T) of the projection objective and an object image shift ($d_{OIS}$) can be smaller than 12. The image plane is the first field plane of the projection objective downstream of the object plane. The projection objective can have a plurality of mirrors, wherein the ratio between an overall length (T) and an object image shift ($d_{OIS}$) is smaller than 2.

30 Claims, 7 Drawing Sheets

(51) Int. Cl.
*G03F 7/20* (2006.01)
*G02B 17/06* (2006.01)

(56) References Cited

U.S. PATENT DOCUMENTS

| | | | |
|---|---|---|---|
| 6,361,176 | B1 | 3/2002 | Mashima |
| 6,396,067 | B1 | 5/2002 | Braat |
| 6,658,084 | B2 | 12/2003 | Singer |
| 6,666,560 | B2 | 12/2003 | Suzuki |
| 6,704,095 | B2 | 3/2004 | Schultz |
| 6,770,894 | B1 | 8/2004 | Schultz |
| 6,859,328 | B2 | 2/2005 | Schultz et al. |
| 7,224,441 | B2 | 5/2007 | Sasaki |
| 7,858,957 | B2 | 12/2010 | Warm et al. |
| 7,973,908 | B2 | 7/2011 | Mann |
| 8,629,972 | B2 * | 1/2014 | Zellner et al. ............ 355/67 |
| 2002/0114089 | A1 * | 8/2002 | Dinger et al. ............ 359/853 |
| 2002/0136351 | A1 | 9/2002 | Singer |
| 2003/0063375 | A1 | 4/2003 | Suzuki et al. |
| 2003/0095622 | A1 | 5/2003 | Schultz et al. |
| 2003/0227603 | A1 | 12/2003 | Dierichs |
| 2004/0065817 | A1 * | 4/2004 | Singer et al. ............ 250/228 |
| 2004/0108467 | A1 | 6/2004 | Eurlings et al. |
| 2005/0002090 | A1 | 1/2005 | Singer et al. |
| 2005/0134980 | A1 | 6/2005 | Mann et al. |
| 2005/0178979 | A1 * | 8/2005 | Masaki et al. ............ 250/492.1 |
| 2006/0132747 | A1 | 6/2006 | Singer et al. |
| 2006/0145094 | A1 | 7/2006 | Wilhelmus et al. |
| 2006/0146413 | A1 | 7/2006 | Klunder et al. |
| 2006/0162739 | A1 | 7/2006 | Sogard |
| 2006/0209302 | A1 * | 9/2006 | Sasaki ............ 356/369 |
| 2007/0058269 | A1 | 3/2007 | Mann et al. |
| 2007/0195317 | A1 | 8/2007 | Schottner et al. |
| 2007/0223112 | A1 | 9/2007 | Mann et al. |
| 2007/0295919 | A1 | 12/2007 | Endres et al. |
| 2008/0123807 | A1 | 5/2008 | Warm et al. |
| 2008/0165415 | A1 | 7/2008 | Chan et al. |
| 2008/0170310 | A1 | 7/2008 | Mann |
| 2008/0246940 | A1 * | 10/2008 | Van Schoot et al. ............ 355/67 |
| 2008/0259303 | A1 | 10/2008 | Ossmann et al. |
| 2008/0278704 | A1 | 11/2008 | Endres et al. |
| 2009/0251677 | A1 | 10/2009 | Endres et al. |
| 2010/0134907 | A1 | 6/2010 | Mann et al. |
| 2011/0026003 | A1 | 2/2011 | Zellner et al. |
| 2011/0122392 | A1 | 5/2011 | Fiolka et al. |
| 2011/0318696 | A1 * | 12/2011 | Endres ............ 430/325 |
| 2014/0104588 | A1 | 4/2014 | Zellner et al. |

FOREIGN PATENT DOCUMENTS

| | | |
|---|---|---|
| DE | 10 2006 043 251 A1 | 3/2007 |
| DE | 10 2006 059 024 A1 | 6/2008 |
| EP | 1 202 101 | 5/2002 |
| EP | 1 594 007 A2 | 11/2005 |
| EP | 1 840 622 | 10/2007 |
| EP | 1 950 594 | 7/2008 |
| EP | 2 005 250 | 12/2008 |
| JP | 2002-015979 | 1/2002 |
| JP | 2002-509653 | 3/2002 |
| JP | 2002-203784 A | 7/2002 |
| JP | 2003-045782 | 2/2003 |
| JP | 2007-264636 | 10/2007 |
| JP | 2008-042203 | 2/2008 |
| JP | 2008-135743 | 6/2008 |
| JP | 2008-158211 | 7/2008 |
| JP | 2008-541439 A | 11/2008 |
| JP | 2009-532724 | 9/2009 |
| TW | 472176 B | 1/2002 |
| WO | WO 99/57596 | 11/1999 |
| WO | WO 2004/010224 A2 | 1/2004 |
| WO | WO 2006/119977 | 11/2006 |
| WO | WO 2007/031271 | 3/2007 |
| WO | WO 2007/115596 | 10/2007 |
| WO | WO 2007/115597 | 10/2007 |
| WO | WO 2008/071305 | 6/2008 |
| WO | WO 2009/156038 | 12/2009 |

OTHER PUBLICATIONS

Japanese office action, with English translation, for corresponding JP Appl No. 2011-500061, dated Jan. 15, 2104.

International Search Report dated May 26, 2009 for corresponding International Application No. PCT/EP2009/001448, filed on Feb. 28, 2009.

Certified English translation of the German priority application DE 10 2008 000 800.1.

Japanese office action, with translation thereof, for corresponding JP Appl No. 2011-500061, dated May 30, 2013.

European office action for EP Application No. 09 722274.9, dated May 14, 2014.

Chinese Office Action, with translation thereof, for CN Appl No. 201210286762.3, dated Dec. 30, 2013.

Chinese office action, with English translation, for CN Appl No. 2012 1028 6762.3, dated Sep. 11, 2014.

Taiwanese office action, with English translation thereof, for TW Appl No. 99 106 422, dated Nov. 12, 2014.

Japanese Office Action with English translation thereof for corresponding JP Appln. No. 2011-500061, 7 pages, dated May 1, 2015.

Chinese Office Action with English translation thereof for corresponding CN Appln. No. 2012 1028 6762.3, 12 pages, dated May 6, 2015.

* cited by examiner

PROJECTION OBJECTIVE FOR MICROLITHOGRAPHY

CROSS-REFERENCE TO RELATED APPLICATIONS

Under 35 U.S.C. §120, this application is a continuation of and claims priority to U.S. Ser. No. 12/884,670, filed on Sep. 17, 2010, now U.S. Pat. No. 8,629,972, which is a continuation of and claims priority to International Application No. PCT/EP 2009/001 448, entitled "PROJECTION OBJECTIVE FOR MICROLITHOGRAPHY," filed on Feb. 28, 2009, which claims priority to German Patent Application No. 10 2008 000 800.1, filed on Mar. 20, 2008 and the German Patent Application No. 10 2008 033 342.5, filed on Jul. 16, 2008. The entire contents of each of the above-referenced applications is incorporated herein by reference.

FIELD OF THE DISCLOSURE

The disclosure relates to a projection objective for microlithography. Furthermore, the disclosure relates to an optical system, in particular including a projection objective of this type, a projection exposure apparatus including an optical system of this type, a method of producing a microstructured component using a projection exposure apparatus of this type, and a microstructured component which is produced according to this method.

BACKGROUND

Examples of projection objectives for microlithography are disclosed in U.S. Pat. No. 6, 266,389 B1, in US 2005/0134980 A1, in US 2007/0195317 A1, in US 2007/0058269 A1, in US 2007/0223112 A, U.S. Pat. Nos. 6,396,067 B1, in 6,361,176 B1 and in U.S. Pat. No. 6, 666,560 B2.

SUMMARY

Conventional projection objectives are still in need of improvement in terms of their total transmission, in terms of an unwanted apodization and in terms of their space requirements, in particular if they are used with EUV illumination light. In certain aspects, the invention features projection objectives exhibiting improved total transmission and reduced or avoided negative apodization effects. As an alternative or in addition thereto, the projection objectives can be relatively compact.

According to one aspect of the invention, the projection objective is provided with at least six mirrors, wherein at least one of the mirrors has a freeform surface, and wherein the ratio between the overall length of the projection objective and the object image shift of the projection objective is smaller than 12. A projection objective of this type may have an intermediate image plane between the object plane and the image plane. This allows given imaging requirements to be fulfilled while minimizing the dimensions of the individual mirrors, in other words of their absolute reflecting surface. In embodiments with an intermediate image plane, it is possible to use mirrors with relatively small radii of curvature. Furthermore, objective designs are conceivable in which a relatively large working distance can be maintained between the exposed reflecting surfaces and the imaging beams passing by the mirrors. The object image shift may have an absolute value which is greater than 120 mm (e.g., greater than 150 mm, greater than 200 mm).

According to another aspect of the invention, the projection objective has at least six mirrors of which at least one mirror has a freeform reflecting surface. The image plane of this projection objective is the first field plane of the projection objective downstream of the object plane. If, accordingly, an intermediate image plane between the object plane and the image plane of the projection objective is dispensed with, this can allow a spectrum of incidence angles, in other words a difference between a largest and a smallest incidence angle of imaging beams impinging upon a respective one of the mirrors, to be kept small. In general, this reduces the demands on a reflective coating on the mirrors. The reflective coating may then either be optimized in terms of a high peak reflection or in terms of an even reflection across the mirror surface, wherein severe variations of incidence angles on one of the mirrors can be neglected in practice. In certain embodiments, the result is a projection objective with a good total transmission which allows the unwanted effect of an apodization to be avoided or reduced. If at least one mirror is designed as a freeform reflecting surface, projection objectives can show minor imaging errors even if no intermediate image plane is provided. The at least six mirrors of the projection objective allow imaging errors to be corrected easily. In some embodiments, projection objectives may be a mirror projection objective (i.e., a catoptric projection objective), in other words a projection objective in which all imaging-beam guiding components are reflective components.

In certain embodiments, projection objectives are characterized by a ration between their overall length (T) and an object image shift ($d_{OIS}$) which is smaller than 5. Such projection objectives can be compact and ensure a good separation of the object field from the image field. The ratio between the overall length and the object image shift can be smaller than 2 (e.g., smaller than 1.5, smaller than 1.1).

In some embodiments, projection objectives include a mirror having a freeform reflecting surface. A freeform reflecting surface can allow imaging errors to be minimized by the projection objective. Other types of freeform surface are conceivable as well. Freeform surfaces cannot be described using a function which is rotationally symmetric with respect to a marked axis which is a normal to a surface area of the mirror surface. In particular, freeform surfaces cannot be described using an asphere equation of the type describing a conic section; furthermore, at least two independent parameters are needed in order to describe the mirror surface. The shape of a boundary of the optically active mirror surface is not important when characterizing a mirror surface as a freeform surface since it is the shape of the surface itself, not its boundary, that determines whether the mirror has a freeform surface. Indeed, a mirror surface can be described using a a rotationally symmetric function while the surface boundary is not rotationally symmetric in shape.

In some embodiments, projection objectives include a plurality of mirrors and have a ratio of T to $d_{OIS}$ that is smaller than 2. Such projection objectives can ensure a good separation of the object field from the image field. The ratio of T to $d_{OIS}$ can be smaller than 1.5 and, more preferably, smaller than 1.1. The projection objectives can be catoptric projection objectives.

According to another aspect of the invention, projection objectives can have a plurality of mirrors of which at least one mirror has a freeform reflecting surface, and at least one intermediate image plane between the object plane and the image plane, wherein the ratio between an overall length (T) of the projection objective and an object image shift ($d_{OIS}$) is smaller than 12. By using the at least one freeform reflecting surface, a distinct object image shift may even be achieved in a projection objective having an intermediate image plane. This may in particular serve to guide the illumination light past further components of a projection exposure apparatus which is equipped with the projection objective without having to make compromises on the incidence angles impinging the mirrors of the projection objective. In particular, virtually all reflections of the illumination light may be achieved with small incidence angles or, alternatively, very large incidence angles (grazing incidence). The intermediate image plane of the projection objective can allow bundles of the imaging light to be guided between the object plane and the image plane, with the bundles having typical bundle dimensions or bundle diameters which, except for the bundles which are guided in the vicinity of a last mirror which defines the numerical aperture of the projection objective, are comparatively small. This may facilitate reduced vignetting during a projection exposure using the projection objective. Furthermore, a projection objective including at least one intermediate image plane has at least two pupil planes of which one is arranged between the object plane and the at least one intermediate image plane while the other is arranged between the at least one intermediate image plane and the image plane. This can enhance the possibilities of controlling illumination parameters by influencing the bundles in or adjacent to the pupil planes.

In some embodiments, projection objectives are characterized in that the distance between a chief ray of a central object field point and a normal to the object plane, the normal passing through the central object field point increases monotonically along a path of the chief ray which starts at the object field and propagates to the image field. A path of the chief ray allocated to the central object field point can allow a large object image shift to be achieved on the mirrors of the projection objective with small to medium incidence angles. In the case of such a chief ray path, there is no portion of the path of the chief ray where the chief ray is guided back in the direction of the normal, which would be counterproductive for achieving a large object image shift.

In some embodiments, projections objectives have an object image shift greater than 200 mm. Absolute values of the object image shift can be advantageous for spatially separating an illumination light beam path upstream of the object field of the projection optics from the imaging beam path in the projection objective.

Projection objectives can be characterized by a ratio of a difference between a largest ($\alpha_{max}$) and a smallest ($\alpha_{min}$) incidence angle of imaging beams impinging upon one of the mirrors on the one hand to a numerical aperture on the image side of the projection objective on the other amounts to a maximum of 60°.

The ratio between a spectrum of incidence angles and a numerical aperture on the image side can result in advantageously low demands on reflective coatings on the mirrors. The spectrum of incidence angle can amount to a maximum of 15° (e.g., a maximum of 13°, a maximum of 12°, a maximum of 10°). Accordingly, the ratio between the spectrum of incidence angles and the numerical aperture on the image side of the projection objective preferably amounts to a maximum of 60° (e.g., a maximum of 52°, a maximum of 48°, a maximum of)40°. A numerical aperture on the image side of 0.25 may be provided. Other numerical apertures on the image side in the range between 0.25 and for instance 0.9, i.e. a numerical aperture on the image side of for instance 0.3, 0.4, 0.5, 0.6, 0.7, 0.8 or 0.9, may be provided as well; this will cause the ratios between the spectrum of incidence angles and the numerical aperture on the image side of the projection objective to change accordingly.

Projection objectives having a numerical aperture (NA=n sin $\alpha$, with n: refractive index, for instance that of flushing gas, $\alpha$: half aperture angle of the objective on the image side) of at least 0.25 can result in a good spatial resolution of the projection objective. The difference between a largest and a smallest incidence angle of imaging beams impinging upon one of the mirrors of the projection objective can amount to a maximum of 0.9 arc sin(NA) (e.g., a maximum of 0.8 arc sin(NA), a maximum of 0.7 arc sin(NA)).

Projection objectives can have fields dimensions of at least 2 mm×26 mm. Such field sizes can ensure a good throughput when operating a projection exposure apparatus including a projection objective of this type.

Projection objectives can exhibit an incidence angle ($\beta$) of an imaging beam allocated to a central object field point on the object field in the range between 5° and 9°. Such which is disposed the an incidence angle can allow a reflection mask to be used on structure that is to be imaged using the projection objective. In some embodiments, the incidence angle amounts in particular to 6°.

Among other advantages, embodiments can improve an optical system including a projection objective and an illumination system for microlithography for guiding illumination light emitted by a light source and for illuminating an object field in such a way that reflection losses are reduced to a minimum when guiding the illumination light. For example, embodiments can include an optical system including an illumination system for microlithography for guiding illumination light which is emitted by a light source, and for illuminating an object field, a projection objective for imaging the objective field into an image field, wherein the illumination system is designed in such a way that the illumination light has an intermediate focus between the light source and the object field, and the optical system is characterized by a ratio between an overall length (T) of the projection objective and an intermediate-focus image shift (D) which is smaller than 5.

Such a ratio between the overall length of the projection objective and the intermediate-focus image shift may guarantee that the illumination light can be guided past components which large space requirements on the image side without requiring any additional illumination light guiding optical components and without requiring extreme incidence angles which might reduce throughput. The ratio between the overall length of the projection objective and the intermediate-focus image shift may be smaller than 3, smaller than 2, smaller than 1.90, smaller than 1.80 and may in particular amount to 1.75. Even smaller ratios are conceivable as well.

A typical space requirement on the image side, when measured in an image plane in the center of the image field, amounts to approximately 1 m, in particular also in the direction of components of the illumination optics, and approximately 1 m as well when measured perpendicular to the image plane away from the image plane.

In some embodiments, having an intermediate focus in the illumination system arranged in a vicinity of an opening of a mirror in the illumination system can enable the illumination light to be guided with particularly small maximum incidence angles impinging the components on the illumination system.

In some embodiments, the illumination system includes a collector and a maximum of three mirrors. Such a design of the illumination system can have a high illumination light throughput due to the low number of reflecting components. The illumination system may in particular have a collector and only two additional mirrors, in other words only two additional reflecting components.

Advantages of the projection objectives, of the optical system and of the projection exposure apparatus become apparent in particular when EUV light is used as illumination light.

BRIEF DESCRIPTION OF THE DRAWINGS

Embodiments will hereinafter be explained in more detail by means of the drawing in which.

DETAILED DESCRIPTION

A projection exposure apparatus 1 for microlithography includes a light source 2 for illumination light 3. The light source 2 is an EUV light source which generates light in a wavelength range between 5 nm and 30 nm. Other EUV wavelengths are conceivable as well. Alternatively, the projection exposure apparatus 1 may also be operated using for instance illumination light 3 with visible wavelengths, UV wavelengths, DUV wavelengths or VUV wavelengths. A beam path of the illumination light 3 is shown very diagrammatically in FIG. 1.

Figure 1:
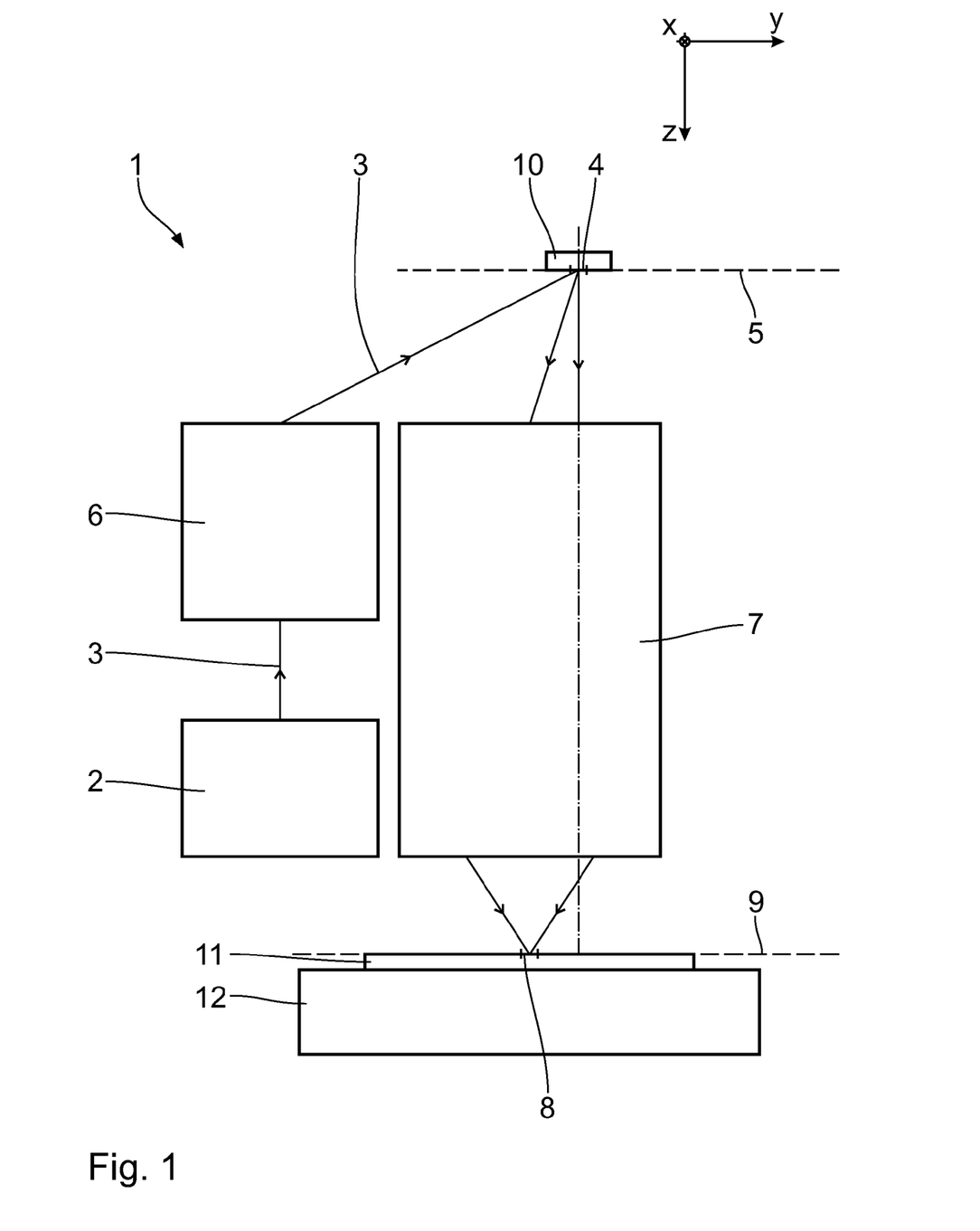
FIG. 1 shows a diagrammatic view of a projection exposure apparatus for microlithography.

The illumination light 3 is guided to an object field 4 in an object plane 5 using an illumination system 6 (also referred to as illumination optics 6). A projection optics 7 in the form of a projection objective is used to image the object field 4 into an image field 8 in an image plane 9 at a given reduction ratio. This reduction ratio is 4:1. When imaged into the image field 8, the object field 4 is thus reduced in size by a factor of 4 using the projection optics 7.

The projection optics 7 reduces images by a factor of 4, for example. Other image scales are conceivable as well, for instance 5×, 6×, 8×, or even image scales which are greater than 8×. Image scales which are smaller than 4× are conceivable as well.

The image plane 9 is parallel to the object plane 5. In this process, a portion of the reflection mask 10 is imaged which coincides with the object field 4. Said portion is imaged onto the surface of a substrate 11 in the form of a wafer which is carried by a substrate holder 12.

In order to facilitate the description of positional relationships, the drawing includes an xyz coordinate system. In FIG. 1, the x-axis is perpendicular to the drawing plane and runs away from the viewer into the drawing plane. The y-axis extends to the right of FIG. 1. The z-axis extends downwardly in FIG. 1.

The reflection mask 10, which is held by a reticle holder (not shown), and the substrate 11 are scanned synchronously in the y-direction during the projection exposure.

Figure 2:
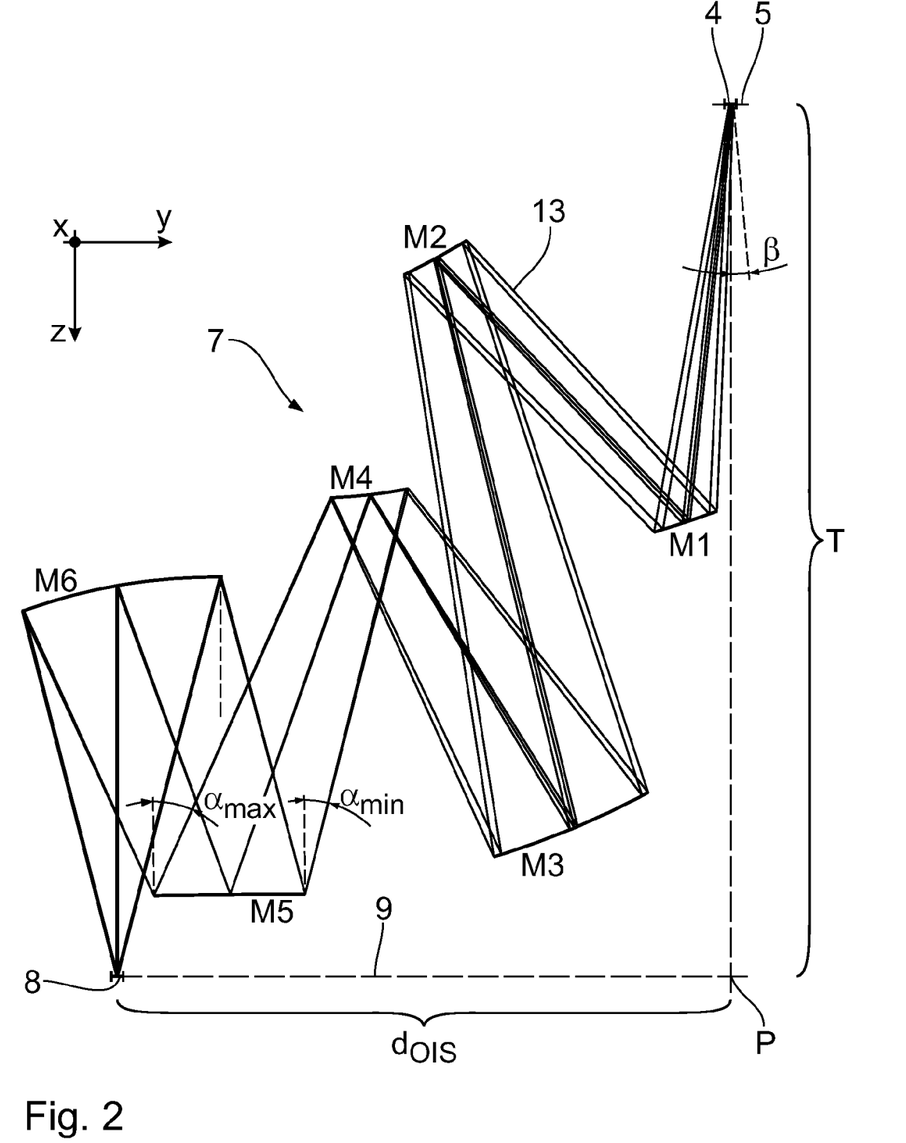
FIG. 2 shows a meridional section containing exemplary imaging beam paths through an embodiment of a projection objective.

FIG. 2 shows a first embodiment of an optical design of the projection optics 7, the FIG. showing the path of individual imaging beams 13 of the illumination light 3 which are emitted by two spaced field points. One of these imaging beams 13 is the chief ray of the central field point, in other words the chief ray of the field point which lies exactly on the intersection of the diagonal which joins the corners of the object field 4 or of the image field 8.

In the projection optics 7, the image plane 9 is the first field plane of the projection optics 7 downstream of the object plane 5. In other words, the projection optics 7 does not have an intermediate image plane.

The projection optics 7 has a numerical aperture of 0.25 on the image side. An overall length T, in other words the distance between the object plane 5 and the image plane 9 of the projection optics 7, amounts to 1,585 mm.

In some embodiments of projection optical systems (not shown) in which the object plane 5 is not parallel to the image plane 9, the overall length T is defined as the distance of a central field point from the image plane. In certain embodiments, a projection objective (not shown) which is equipped with an uneven number of mirrors, for instance seven or nine mirrors, the overall length is defined as the maximum distance between one of the mirrors and one of the field planes.

An object image shift $d_{OIS}$ of the projection optics 7 amounts to 1,114.5 mm. The object image shift $d_{OIS}$ is the distance of a perpendicular projection P of a central object field point onto the image plane 8 from the central image point.

In the projection optics according to FIG. 2, the ratio between the overall length T and the object image shift $d_{OIS}$ therefore amounts to approximately 1.42.

The field size of the projection optics 7 in the image plane 9 amounts to 2 mm in the y-direction and 26 mm in the x-direction while in the object plane 5, the field size amounts to 8 mm in the y-direction and 108 mm in the x-direction.

The object field 4 and the image field 8 are rectangular. The fields may generally also have the shape of a sector of a circle with a corresponding xy aspect ratio, in other words they may also have a curved shape.

The y-dimension of the fields is also referred to as slot height while the x-dimension is also referred to as slot width.

An incidence angle β of the imaging beams 13 impinging upon the object field 4, in other words on the reflection mask 10, amounts to 6°. Other incidence angles β are conceivable as well.

The projection optics 7 includes a total of six mirrors M1, M2, M3, M4, M5, M6 which are numbered in the order in which they are exposed to the illumination light 3. The mirrors M3 and M6 are concave. The mirror M4 is convex. It shall be noted that FIG. 2 only shows the reflecting surfaces of the mirrors M1 to M6; other aspects such as the entire mirror bodies or associated holders are omitted.

The mirrors M1 to M6 are exposed to the illumination light 3 with in each case a particular spectrum of incidence angles. Said spectrum of incidence angles is the difference between a smallest incidence angle $\alpha_{min}$ and a largest incidence angle $\alpha_{max}$ impinging the respective mirror M1 to M6. This is shown in FIG. 2 by the example of the second last mirror M5 which has the greatest absolute spectrum of incidence angles of the projection optics 7.

The following table shows the spectrum of incidence angles $\alpha_{max}-\alpha_{min}$ of the mirrors M1 to M6:

| Mirror | $\alpha_{max}$-$\alpha_{min}$ |
|---|---|
| M1 | 4.4° |
| M2 | 5.5° |
| M3 | 2.3° |
| M4 | 2.2° |
| M5 | 10° |
| M6 | 9.6° |

In the meridional section of FIG. 2, the smallest incidence angle $\alpha_{min}$, which amounts to approximately 14°, can be found on the right-hand edge of the mirror M5. The largest incidence angle $\alpha_{max}$ of FIG. 2, amounts to approximately 24°, can be found on the left-hand edge of the mirror M5. Therefore, the mirror M5 has a spectrum of incidence angles of 10°. This spectrum of incidence angles is at the same time the greatest difference between the incidence angles impinging one of the mirrors M1 to M6. The incidence angles impinging the mirrors M1 to M6 of the projection optics 7 are almost exclusively in a range of excellent fulfilment of the approximation of small angles ($0° \leq \alpha \leq 7°$). Therefore, the mirrors M1 to M6 are coated with a reflective coating which is evenly applied across their entire reflecting surface.

The reflective coating is in particular a multilayer coating, in other words a stack of alternating molybdenum and silicon layers as is usual for EUV reflective coatings. The small spectrum of maximum incidence angles of only 10° ensures that the reflections on all mirrors M1 and M6 are constant in good approximation. An unwanted variation in reflection across the respective mirror surface or an excessive apodization is thus avoided in the projection optics 7. Apodization is defined as the variation of the intensity distribution of the illumination light 3 across the pupil. If $I_{max}$ is the maximum intensity of the illumination light 3 in a pupil plane of the projection optics 7 and $I_{min}$ is the minimum intensity of the illumination light 3 across said pupil plane, the value $$A = (I_{max} - I_{min})/I_{max}$$

is a measure of apodization.

At least one of the mirrors M1 to M6 has a reflecting surface which is a freeform reflecting surface having a biconical basic shape and which may be described using the following surface formula:

$$z = \frac{cvx \cdot x^2 + cvy \cdot y^2}{1 + \sqrt{1 - cvx^2(ccx+1)x^2 - cvy^2(ccy+1)y^2}} + \sum_{i=0}^{n}\sum_{j=0}^{i} \alpha_{j,i-j} x^j y^{i-j}$$

x and y represent the coordinates on the reflecting surface starting from a coordinate origin which is defined as the penetration point of a normal through the reflecting surface. In theory, this penetration point may be disposed beyond the useful reflecting surface.

z represents the sagittal height of the freeform reflecting surface. The coefficients cvx and cvy describe the curvatures of the freeform reflecting surface in an xy sectional view and in an xz sectional view. The coefficients ccx and ccy are conical parameters.

The freeform surface formula is composed of a first biconical term and a subsequent xy polynomial with coefficients $a_{ji}$.

The following tables specify the arrangement and shape of the optical surfaces of the mirrors M1 to M6 in the projection optics 7.

In the first column of table 1, selected surfaces are denoted by numbers. The second column contains the respective distances of each surface from the respectively nearest surface in the z-direction. The third column of table 1 lists respective y-decentrations of the local coordinate system of each surface with respect to a global coordinate system.

The last column of table 1 allows the defined surfaces to be allocated to the components of the projection optics 7.

TABLE 1

| Surface | Distance from preceding surface | y-decentration | |
|---|---|---|---|
| 0 | 0.000000 | 0 | image plane |
| 1 | 708.322803 | 0 | |
| 2 | −617.533694 | −91.468948 | M6 |
| 3 | 583.375491 | −91.682056 | M5 |
| 4 | −593.218566 | −91.059467 | M4 |
| 5 | 648.730180 | −155.250886 | M3 |
| 6 | −403.572644 | −96.008370 | M2 |
| 7 | 674.571026 | −73.556295 | M1 |
| 8 | 0.000000 | −656.479198 | object plane |

Table 2 contains the data of the respective freeform reflecting surface of the mirrors M6 (surface 2), M5 (surface 3), M4 (surface 4), M3 (surface 5), M2 (surface 6) and M1 (surface 7). Coefficients which are not listed in the table equal zero. Furthermore, the following applies: RDX=1/cvx; RDY=1/cvy.

TABLE 2

| Freeform data | | |
|---|---|---|
| Surface | 2 | |
| RDY | −970.864728 | |
| RDX | −994.977890 | |
| CCY | 0.433521 | |
| CCX | 0.477907 | |
| j | i-j | $a_{j, i-j}$ |
| 0 | 1 | −1.160933E−03 |
| 2 | 0 | −2.807756E−05 |
| 0 | 2 | −2.400704E−05 |
| 2 | 1 | −2.727535E−10 |
| 0 | 3 | −1.561712E−09 |
| Surface | 3 | |
| RDY | −859.920276 | |
| RDX | −909.711920 | |
| CCY | 2.066084 | |
| CCX | 2.157360 | |
| j | i-j | $a_{j, i-j}$ |
| 0 | 1 | −6.956243E−03 |
| 2 | 0 | 4.069558E−04 |
| 0 | 2 | 4.110308E−04 |
| 2 | 1 | −1.135961E−08 |
| 0 | 3 | −3.068762E−08 |
| Surface | 4 | |
| RDY | 2123.400000 | |
| RDX | 1668.900000 | |
| CCY | 11.575729 | |
| CCX | 7.435682 | |
| j | i-j | $a_{j, i-j}$ |
| 0 | 1 | 1.393833E−01 |
| 2 | 0 | 3.570289E−04 |
| 0 | 2 | 4.726719E−04 |
| 2 | 1 | 4.922014E−08 |
| 0 | 3 | 1.301911E−09 |
| Surface | 5 | |
| RDY | 1292.100000 | |
| RDX | 1411.600000 | |
| CCY | −0.067691 | |
| CCX | 0.332429 | |
| j | i-j | $a_{j, i-j}$ |
| 0 | 1 | 2.827164E−03 |
| 2 | 0 | 3.218435E−05 |
| 0 | 2 | 6.355344E−07 |

TABLE 2-continued

Freeform data

| j | i-j | $a_{j,\,i\text{-}j}$ |
|---|-----|------|
| 2 | 1 | 3.212318E−09 |
| 0 | 3 | 3.463152E−09 |

| Surface | 6 | |
|---------|---|---|
| RDY | −2615.500000 | |
| RDX | −11975.000000 | |
| CCY | 0.354474 | |
| CCX | 58.821858 | |

| j | i-j | $a_{j,\,i\text{-}j}$ |
|---|-----|------|
| 0 | 1 | −1.510373E−01 |
| 2 | 0 | 2.929133E−04 |
| 0 | 2 | 3.971921E−04 |
| 2 | 1 | −2.211237E−08 |
| 0 | 3 | 2.084484E−08 |

| Surface | 7 | |
|---------|---|---|
| RDY | 171.052222 | |
| RDX | 507.844993 | |
| CCY | −1.000256 | |
| CCX | −1.006263 | |

| j | i-j | $a_{j,\,i\text{-}j}$ |
|---|-----|------|
| 0 | 1 | 1.224307E−02 |
| 2 | 0 | −7.916373E−04 |
| 0 | 2 | −2.757507E−03 |
| 2 | 1 | −3.313700E−08 |
| 0 | 3 | −7.040288E−09 |

Figure 3:
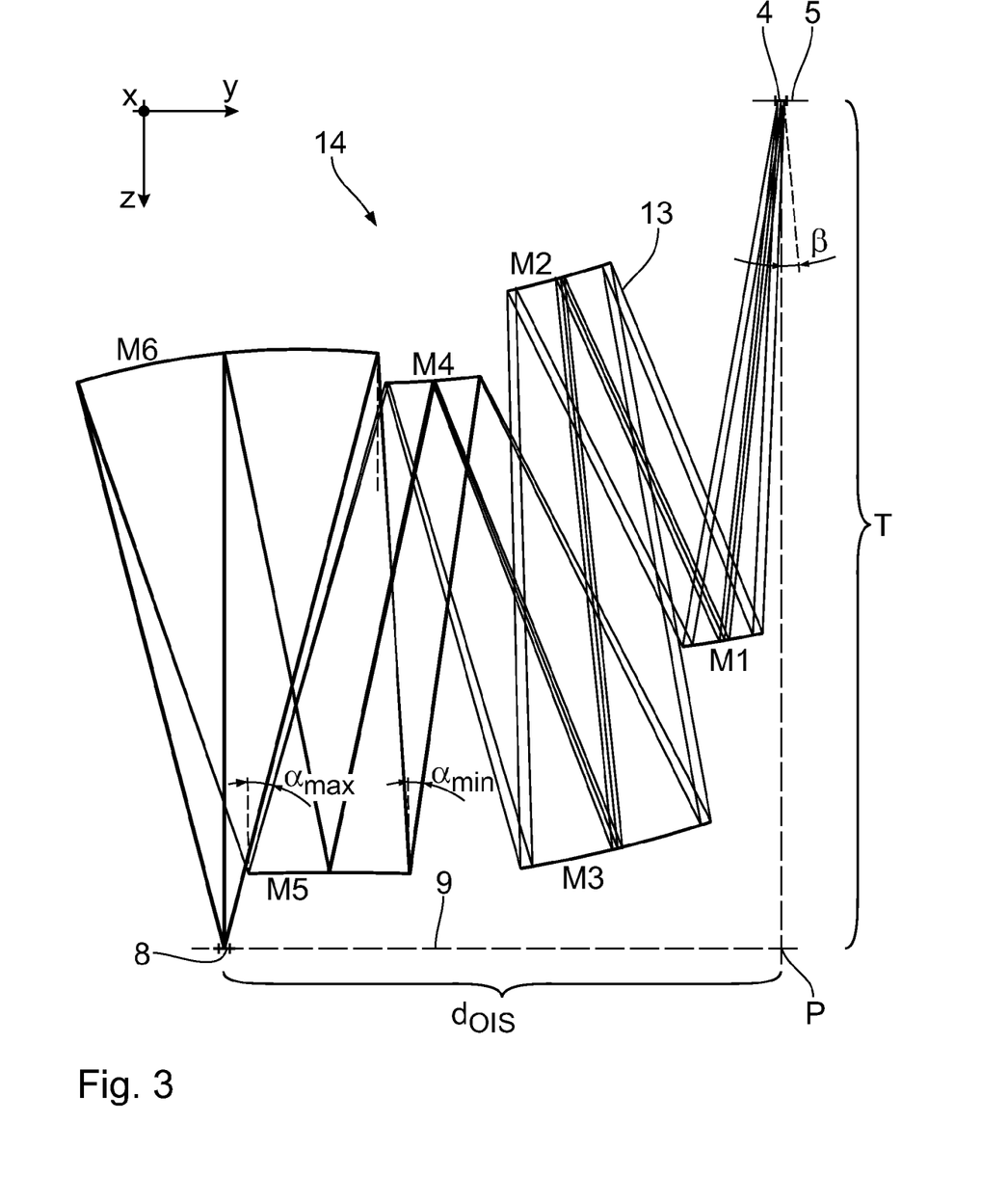
FIG. 3 shows a similar view to FIG. 2 of another embodiment of a projection objective.

FIG. 3 shows another embodiment of a projection optics 14 which may be used in the projection exposure apparatus 1 according to FIG. 1 instead of the projection optics 7. Components of the projection optics 14 which correspond to those that have already been explained above in relation to the projection optics 7 have the same reference numerals and are not described in detail again.

The projection optics 14 has a numerical aperture of 0.25 on the image side. The overall length T of the projection optics 14 amounts to 1000 mm. The object image shift $d_{OIS}$ of the projection optics 14 amounts to 656.5 mm. Therefore, the ratio of $T/d_{OIS}$ amounts to approximately 1.52.

In the projection optics 14, the spectrum of maximum incidence angles, which amounts to 12°, can be found on the mirror M5 as well. The minimum incidence angle, which amounts to approximately 6°, is found on the mirror M5 on the right-hand edge of FIG. 3. The maximum incidence angle, which amounts to approximately 18°, is found on the mirror M5 on the left-hand edge of FIG. 3. In the projection optics 14, the image plane 9 is the first field plane downstream of the object plane 5 as well.

In the projection optics 14, at least one of the mirrors M1 to M6 is a biconical freeform reflecting surface as well.

The following tables specify the arrangement and shape of the optical surfaces of the mirrors M1 to M6 in the projection optics 14. In the first column of table 3, selected surfaces are denoted by numbers. The second column contains the respective distances of each surface from the respective nearest surface in the z-direction. The third column of table 3 lists respective y-decentrations of the local coordinate system of each surface with respect to a global coordinate system.

The last column of table 3 allows the defined surfaces to be allocated to the components of the projection optics 14.

TABLE 3

| Surface | Distance from preceding surface | y-decentration | |
|---------|------|------|------|
| 0 | 0.000000 | 0 | image plane |
| 1 | 636.883689 | 0 | |
| 2 | −584.268871 | −127.232050 | M6 |
| 3 | 649.268844 | −127.625397 | M5 |
| 4 | −689.518581 | −127.310875 | M4 |
| 5 | 635.140406 | −214.759354 | M3 |
| 6 | −438.983578 | −160.525812 | M2 |
| 7 | 792.496449 | −161.853347 | M1 |
| 8 | 0.000000 | −978.074419 | object plane |

Table 4 contains the data of the respective freeform reflecting surface of the mirrors M6 (surface 2), M5 (surface 3), M4 (surface 4), M3 (surface 5), M2 (surface 6) and M1 (surface 7). Coefficients which are not listed in the table equal zero. Furthermore, the following applies: RDX=1/cvx; RDY=1/cvy.

TABLE 4

Freeform data

| Surface | 2 | |
|---------|---|---|
| RDY | −1024.300000 | |
| RDX | −1051.200000 | |
| CCY | 0.715756 | |
| CCX | 0.739924 | |

| j | i-j | $a_{j,\,i\text{-}j}$ |
|---|-----|------|
| 0 | 1 | −7.576779E−04 |
| 2 | 0 | −3.738732E−05 |
| 0 | 2 | −4.247383E−05 |
| 2 | 1 | 9.295774E−10 |
| 0 | 3 | −2.890724E−09 |
| 4 | 0 | −7.975116E−13 |
| 2 | 2 | −5.165327E−12 |
| 0 | 4 | 3.661841E−13 |
| 4 | 1 | −7.996231E−16 |
| 2 | 3 | 2.111768E−15 |
| 0 | 5 | −1.722248E−15 |
| 6 | 0 | −5.045304E−19 |
| 4 | 2 | 5.124801E−18 |
| 2 | 4 | 6.369116E−18 |
| 0 | 6 | −1.032383E−18 |

| Surface | 3 | |
|---------|---|---|
| RDY | −1035.900000 | |
| RDX | −1101.300000 | |
| CCY | 2.617124 | |
| CCX | 2.951155 | |

| j | i-j | $a_{j,\,i\text{-}j}$ |
|---|-----|------|
| 0 | 1 | −2.179019E−03 |
| 2 | 0 | 4.431389E−04 |
| 0 | 2 | 4.560760E−04 |
| 2 | 1 | −1.644268E−08 |
| 0 | 3 | −2.950490E−08 |
| 4 | 0 | 2.263165E−11 |
| 2 | 2 | 1.778578E−11 |
| 0 | 4 | 1.964554E−12 |
| 4 | 1 | 1.279827E−14 |
| 2 | 3 | 6.648394E−14 |
| 0 | 5 | −2.265488E−14 |
| 6 | 0 | 2.095952E−17 |
| 4 | 2 | 4.287989E−17 |
| 2 | 4 | −1.642439E−17 |
| 0 | 6 | −2.118969E−17 |

| Surface | 4 | |
|---------|---|---|
| RDY | 1665.900000 | |
| RDX | 1372.000000 | |
| CCY | 9.138623 | |
| CCX | 1.926620 | |

| j | i-j | $a_{j,\,i\text{-}j}$ |
|---|-----|------|
| 0 | 1 | 2.014437E−01 |
| 2 | 0 | 2.109164E−04 |
| 0 | 2 | 4.684147E−04 |
| 2 | 1 | 1.447739E−09 |
| 0 | 3 | 3.484838E−09 |
| 4 | 0 | −1.165581E−24 |
| 2 | 2 | 4.175896E−13 |

TABLE 4-continued

Freeform data

| j | i-j | $a_{j,\,i\text{-}j}$ |
|---|---|---|
| 0 | 4 | 7.119405E−12 |
| 4 | 1 | 5.269322E−14 |
| 2 | 3 | −2.420761E−14 |
| 0 | 5 | −2.012170E−14 |
| 6 | 0 | −3.454027E−16 |
| 4 | 2 | 1.557629E−16 |
| 2 | 4 | −1.050420E−15 |
| 0 | 6 | −2.742748E−17 |

Surface 5
RDY 1238.200000
RDX 1414.200000
CCY −0.000012
CCX 0.119482

| j | i-j | $a_{j,\,i\text{-}j}$ |
|---|---|---|
| 0 | 1 | 1.047982E−02 |
| 2 | 0 | 2.196150E−05 |
| 0 | 2 | 7.186632E−07 |
| 2 | 1 | 4.040466E−09 |
| 0 | 3 | 9.100125E−09 |
| 4 | 0 | 5.634656E−12 |
| 2 | 2 | −2.298266E−14 |
| 0 | 4 | −4.645176E−13 |
| 4 | 1 | 9.046464E−16 |
| 2 | 3 | −2.605868E−16 |
| 0 | 5 | −1.673891E−15 |
| 6 | 0 | −2.618503E−18 |
| 4 | 2 | 4.839689E−18 |
| 2 | 4 | −6.947211E−18 |
| 0 | 6 | −4.314040E−18 |

Surface 6
RDY −3684.400000
RDX −3506.300000
CCY −0.001235
CCX 0.415150

| j | i-j | $a_{j,\,i\text{-}j}$ |
|---|---|---|
| 0 | 1 | −1.767860E−01 |
| 2 | 0 | 5.073838E−04 |
| 0 | 2 | 5.272916E−04 |
| 2 | 1 | −3.957421E−08 |
| 0 | 3 | 8.058238E−09 |
| 4 | 0 | 7.959552E−25 |
| 2 | 2 | −7.112502E−13 |
| 0 | 4 | 6.827653E−13 |
| 4 | 1 | −2.253930E−13 |
| 2 | 3 | 1.303253E−13 |
| 0 | 5 | 1.567942E−15 |
| 6 | 0 | −2.326019E−16 |
| 4 | 2 | −2.314170E−16 |
| 2 | 4 | 1.309455E−16 |
| 0 | 6 | −5.879379E−18 |

Surface 7
RDY 167.705178
RDX 408.126726
CCY −1.001961
CCX −0.994641

| j | i-j | $a_{j,\,i\text{-}j}$ |
|---|---|---|
| 0 | 1 | −2.378224E−04 |
| 2 | 0 | −1.003186E−03 |
| 0 | 2 | −2.870643E−03 |
| 2 | 1 | −3.511331E−09 |
| 0 | 3 | −1.211650E−07 |
| 4 | 0 | −7.010621E−11 |
| 2 | 2 | −5.812898E−12 |
| 0 | 4 | −4.637999E−13 |
| 4 | 1 | −1.913197E−13 |
| 2 | 3 | 6.243649E−16 |
| 0 | 5 | 4.280774E−16 |
| 6 | 0 | −5.399656E−17 |
| 4 | 2 | −1.237113E−16 |
| 2 | 4 | 1.580174E−19 |
| 0 | 6 | 6.222451E−19 |

Figure 4:
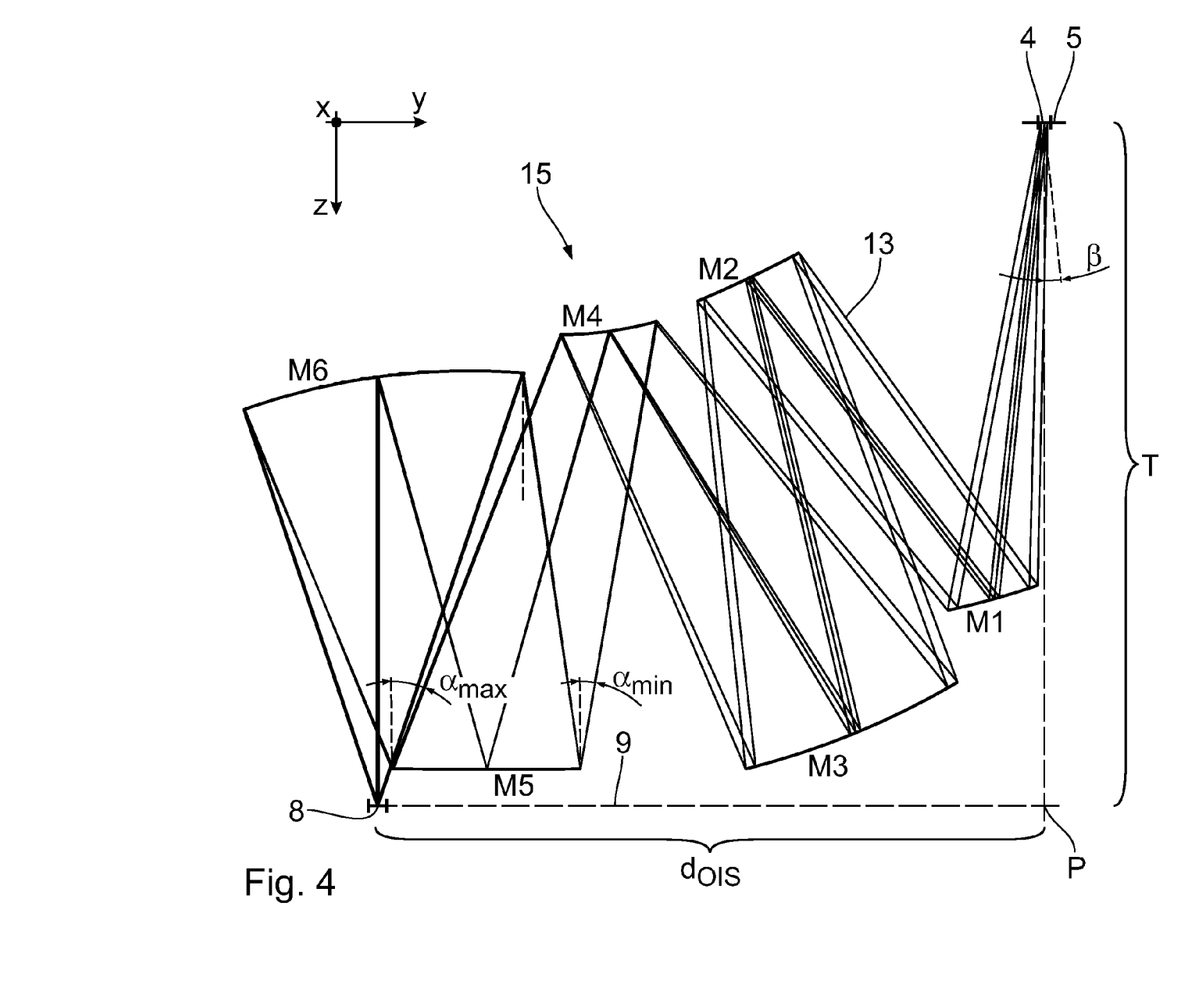
FIG. 4 shows a similar view to FIG. 2 of another embodiment of a projection objective.

FIG. 4 shows another embodiment of a projection optics 15 which may be used in the projection exposure apparatus according to FIG. 1 instead of the projection optics 7. Components of the projection optics 15 which correspond to those that have already been explained above in relation to the projection optics 7 have the same reference numerals and are not discussed in detail again.

The projection optics 15 has a numerical aperture of 0.32 on the image side. The overall length T of the projection optics 15 amounts to 1,000 mm. The object image shift $d_{OIS}$ of the projection optics 15 amounts to 978 mm. The ratio of $T/d_{OIS}$ therefore amounts to approximately 1.02.

In the projection optics 15, the spectrum of maximum incidence angles, which amounts to 13°, can be found on the mirror M5 as well. The minimum incidence angle, which amounts to approximately 9°, is found on the mirror M5 on the right-hand edge of FIG. 4. The maximum incidence angle, which amounts to approximately 22°, is found on the mirror M5 on the left-hand edge of FIG. 4. In the projection optics 15, the image plane 9 is the first field plane downstream of the object plane 5 as well.

In the projection optics 15, at least one of the mirrors M1 to M6 is a biconical freeform reflecting surface as well.

The following tables specify the arrangement and shape of the optical surfaces of the mirrors M1 to M6 in the projection optics 15.

In the first column of table 5, selected surfaces are denoted by numbers. The second column contains the respective distances of each surface from the respective nearest surface in the z-direction. The third column of table 5 lists respective y-decentrations of the local coordinate system of each surface with respect to a global coordinate system.

The last column of table 5 allows the defined surfaces to be allocated to the components of the projection optics 15.

TABLE 5

| Surface | Distance to preceding surface | y-decentration | |
|---|---|---|---|
| 0 | 0.000000 | 0.000000 | image plane |
| 1 | 726.023335 | 0.000000 | |
| 2 | −577.595015 | −192.238869 | M6 |
| 3 | 745.417411 | −192.777551 | M5 |
| 4 | −738.103985 | −192.462469 | M4 |
| 5 | 994.730526 | −243.767917 | M3 |
| 6 | −450.919688 | −164.949143 | M2 |
| 7 | 885.694809 | −165.918838 | M1 |
| 8 | 0.000000 | −1114.493643 | object plane |

Table 6 contains the data of the respective freeform reflecting surface of the mirrors M6 (surface 2), M5 (surface 3), M4 (surface 4), M3 (surface 5), M2 (surface 6) and M1 (surface 7). Coefficients which are not listed in the table equal zero. Furthermore, the following applies: RDX=1/cvx; RDY=1/cvy.

TABLE 6

Freeform data

Surface 2
RDY −1172.300000
RDX −1295.000000
CCY 0.787469
CCX 1.053600

| j | i-j | $a_{j,\,i\text{-}j}$ |
|---|---|---|
| 0 | 1 | −7.219074E−04 |
| 2 | 0 | −3.578974E−05 |
| 0 | 2 | −2.128273E−05 |
| 2 | 1 | 7.097815E−10 |
| 0 | 3 | −1.618913E−09 |
| 4 | 0 | −2.252005E−12 |
| 2 | 2 | −3.895991E−12 |
| 0 | 4 | 2.750606E−13 |

TABLE 6-continued

Freeform data

| j | i-j | $a_{j, i\text{-}j}$ |
|---|---|---|
| 4 | 1 | -4.464498E-15 |
| 2 | 3 | -4.637860E-16 |
| 0 | 5 | -6.920120E-16 |
| 6 | 0 | -3.637297E-18 |
| 4 | 2 | 2.537830E-18 |
| 2 | 4 | 1.002850E-17 |
| 0 | 6 | -3.044197E-18 |
| Surface | 3 | |
| RDY | -1236.400000 | |
| RDX | -1536.200000 | |
| CCY | 2.551177 | |
| CCX | 4.047183 | |
| j | i-j | $a_{j, i\text{-}j}$ |
| 0 | 1 | -6.558677E-03 |
| 2 | 0 | 3.540129E-04 |
| 0 | 2 | 4.133618E-04 |
| 2 | 1 | -1.904320E-08 |
| 0 | 3 | -3.576692E-08 |
| 4 | 0 | 1.496417E-12 |
| 2 | 2 | 1.864663E-11 |
| 0 | 4 | 3.000005E-12 |
| 4 | 1 | -7.105811E-15 |
| 2 | 3 | 5.293727E-14 |
| 0 | 5 | -1.509974E-14 |
| 6 | 0 | 2.907360E-18 |
| 4 | 2 | 5.694619E-17 |
| 2 | 4 | 8.177232E-17 |
| 0 | 6 | 4.847943E-18 |
| Surface | 4 | |
| RDY | 2267.500000 | |
| RDX | 1709.200000 | |
| CCY | 13.716154 | |
| CCX | 2.188445 | |
| j | i-j | $a_{j, i\text{-}j}$ |
| 0 | 1 | 2.536301E-01 |
| 2 | 0 | 1.786226E-04 |
| 0 | 2 | 4.303983E-04 |
| 2 | 1 | -5.494928E-10 |
| 0 | 3 | 4.116436E-09 |
| 4 | 0 | -2.775915E-11 |
| 2 | 2 | 3.269596E-11 |
| 0 | 4 | 3.121929E-12 |
| 4 | 1 | 2.286620E-14 |
| 2 | 3 | 1.431437E-14 |
| 0 | 5 | -8.016660E-15 |
| 6 | 0 | -8.966865E-17 |
| 4 | 2 | 3.631639E-16 |
| 2 | 4 | -3.150250E-16 |
| 0 | 6 | -7.235944E-18 |
| Surface | 5 | |
| RDY | 1453.100000 | |
| RDX | 1691.600000 | |
| CCY | 0.004158 | |
| CCX | 0.130787 | |
| j | i-j | $a_{j, i\text{-}j}$ |
| 0 | 1 | 1.413720E-02 |
| 2 | 0 | 1.853431E-05 |
| 0 | 2 | 8.632041E-07 |
| 2 | 1 | 2.471907E-09 |
| 0 | 3 | 1.031600E-08 |
| 4 | 0 | 1.594814E-12 |
| 2 | 2 | 1.271047E-13 |
| 0 | 4 | -8.477699E-14 |
| 4 | 1 | 1.841514E-15 |
| 2 | 3 | 1.063273E-15 |
| 0 | 5 | -3.890516E-16 |
| 6 | 0 | -7.937130E-19 |
| 4 | 2 | 4.923627E-18 |
| 2 | 4 | -3.489821E-18 |
| 0 | 6 | -3.625541E-18 |
| Surface | 6 | |
| RDY | -3061.000000 | |
| RDX | -3961.700000 | |
| CCY | 0.069638 | |
| CCX | 0.416068 | |
| j | i-j | $a_{j, i\text{-}j}$ |
| 0 | 1 | -1.950186E-01 |
| 2 | 0 | 4.908498E-04 |
| 0 | 2 | 5.948960E-04 |
| 2 | 1 | -2.711540E-08 |
| 0 | 3 | 1.073427E-08 |
| 4 | 0 | -3.053221E-12 |
| 2 | 2 | -5.601149E-12 |
| 0 | 4 | 4.072326E-13 |
| 4 | 1 | -3.675214E-13 |
| 2 | 3 | 3.165916E-14 |
| 0 | 5 | -1.649353E-15 |
| 6 | 0 | -8.908751E-17 |
| 4 | 2 | -2.427088E-16 |
| 2 | 4 | 2.643106E-16 |
| 0 | 6 | -7.400900E-18 |
| Surface | 7 | |
| RDY | 210.148013 | |
| RDX | 383.382688 | |
| CCY | -1.001702 | |
| CCX | -0.999069 | |
| j | i-j | $a_{j, i\text{-}j}$ |
| 0 | 1 | -2.506963E-04 |
| 2 | 0 | -1.093695E-03 |
| 0 | 2 | -2.285463E-03 |
| 2 | 1 | -7.246135E-09 |
| 0 | 3 | -1.030905E-07 |
| 4 | 0 | -7.535621E-11 |
| 2 | 2 | -4.600461E-12 |
| 0 | 4 | -9.217052E-14 |
| 4 | 1 | -2.057821E-13 |
| 2 | 3 | 2.433632E-16 |
| 0 | 5 | 1.627316E-16 |
| 6 | 0 | -1.969282E-17 |
| 4 | 2 | -1.033559E-16 |
| 2 | 4 | 2.086873E-17 |
| 0 | 6 | 1.058816E-18 |

Figure 5:
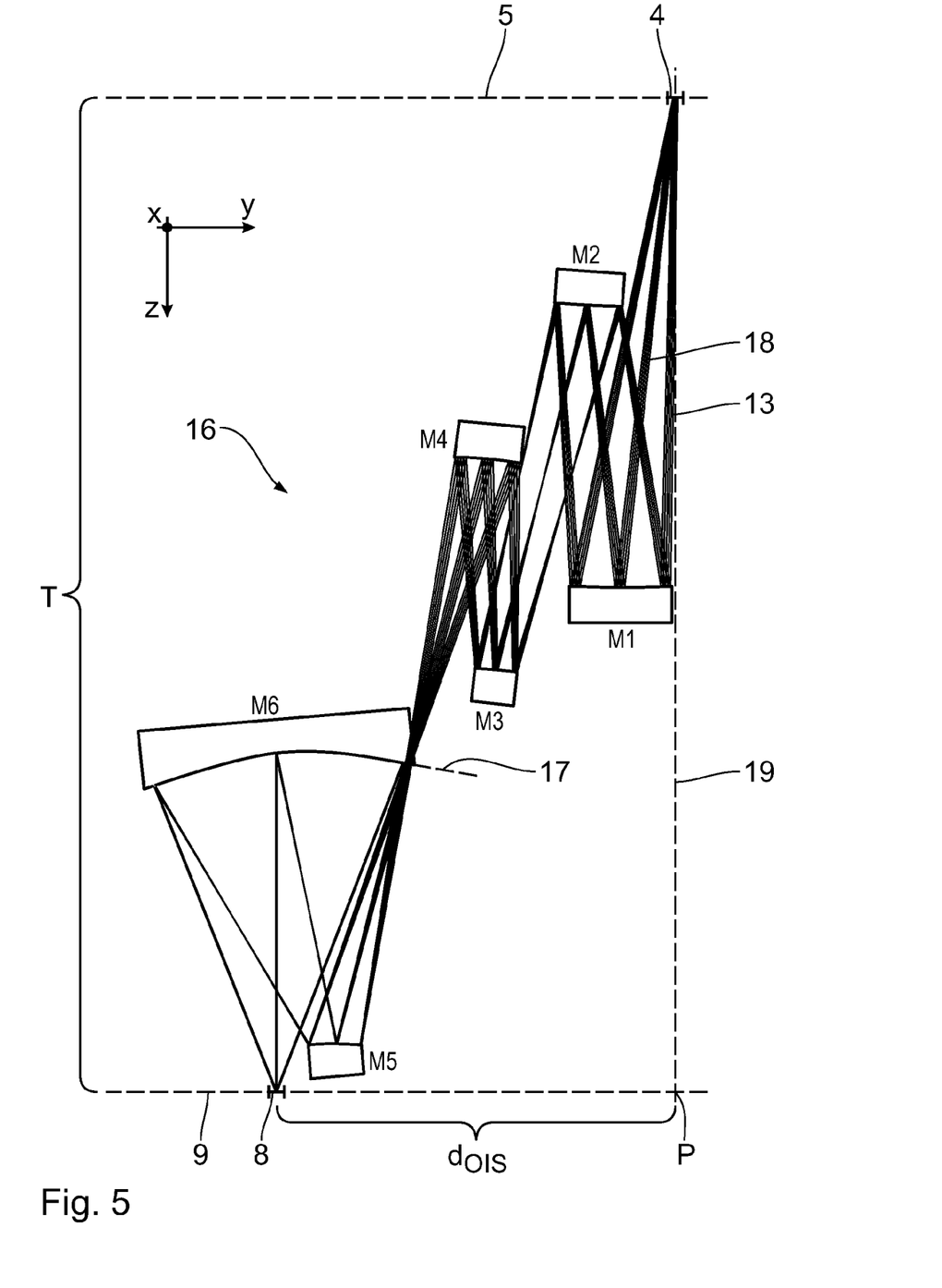
FIG. 5 shows a similar view to FIG. 2 of another embodiment of a projection objective.

FIG. 5 shows another embodiment of a projection optics 16 which may be used in the projection exposure apparatus 1 according to FIG. 1 instead of the projection optics 7. Components of the projection optics 16 which correspond to those that have already been explained above in relation to the projection optics 7 have the same reference numerals and are not discussed in detail again.

The projection optics 16 has a numerical aperture of 0.35 on the image side. The overall length T of the projection optics 16 amounts to 1,500 mm. The object image shift $d_{OIS}$ of the projection optics 16 amounts to 580 mm. The ratio of $T/d_{OIS}$ therefore amounts to approximately 2.59.

On the mirror M5 of the projection optics 16, there is a minimum incidence angle of 0.15° and a maximum incidence angle of 23.72°. The spectrum of maximum incidence angles, which is found on the mirror M5, therefore amounts to 23.58°, which is the greatest spectrum of incidence angles to be found on one of the mirrors of the projection optics 16.

The projection optics 16 has an intermediate image plane 17 between the mirrors M4 and M5. Said intermediate image plane 17 is approximately disposed at the point where the imaging beams 13 are guided past the mirror M6.

The freeform reflecting surfaces of the mirrors M1 to M6 of the projection optics 16 can be described mathematically by the following equation:

$$Z = \frac{cr^2}{1 + \sqrt{1-(1+k)c^2r^2}} + \sum_{j=2}^{N} C_j X^m Y^n$$

with $$j = \frac{(m+n)^2 + m + 3n}{2} + 1$$

Z represents the sagittal height of the freeform surface at the point x, y ($x^2+y^2=r^2$).

c is a constant which corresponds to the apex curvature of a corresponding asphere. k corresponds to a conical constant of a corresponding asphere. $C_j$ are the coefficients of the monomials $X^m Y^n$. Typically, the values of c, k and $C_j$ are determined on the basis of the desired optical properties of the mirror in the projection optics 16. The order of the monomial, m+n, can be changed as required. A higher-order monomial may result in a design of the projection optics which facilitates the correction of imaging errors but is more difficult to calculate. m+n may take values between 3 and more than 20.

Freeform surfaces can also be described mathematically using Zernike polynomials which are for instance explained in the manual of the optical design program CODE V®. Alternatively, freeform surfaces can be described using of two-dimensional spline surfaces. Examples thereof are Bezier curves or non-uniform rational basis splines (NURBS). Two-dimensional spline surfaces can for instance be described by a set of points in an xy plane and their respective z values or by these points and their respective slopes. Depending on the type of spline surface, the entire surface is obtained by interpolation between the points of the set by using for instance polynomials or functions which have particular properties in terms of their continuity and differentiability. Examples thereof are analytical functions.

The optical design data of the reflecting surfaces of the mirrors M1 to M6 of the projection optics 16 are listed in the following tables. The first one of these tables contains the respective reciprocal of the apex curvature (radius) and a distance value (thickness) for the optical surfaces of the optical components and for the aperture diaphragm, the distance value corresponding to the z-distance of adjacent elements in the beam path starting from the object plane. The second table contains the coefficients $C_j$ of the monomials $X^m Y^n$ in the above freeform surface equation for the mirrors M1 to M6, with Nradius being a normalizing constant. The second table is followed by a third table in which are listed the absolute values (in mm) of y-decentration and x-rotation of the respective mirror with respect to a reference design of a mirror. This corresponds to the processes of decentration (in the y-direction) and rotation (about the x-axis) during the freeform surface design process, with the angle of rotation being specified in degrees.

| Surface | Radius | Distance | Mode of operation |
|---|---|---|---|
| Object plane | INFINITY | 727.645 | |
| Mirror 1 | −1521.368 | −420.551 | REFL |
| Mirror 2 | 4501.739 | 540.503 | REFL |
| Mirror 3 | 501.375 | −313.416 | REFL |
| Mirror 4 | 629.382 | 868.085 | REFL |
| Mirror 5 | 394.891 | −430.827 | REFL |
| Mirror 6 | 527.648 | 501.480 | REFL |
| Image plane | INFINITY | 0.000 | |

| Coefficient | M1 | M2 | M3 | M4 | M5 | M6 |
|---|---|---|---|---|---|---|
| K | −6.934683E+00 | −1.133415E+02 | −4.491203E+00 | 2.864941E−01 | 6.830961E+00 | 8.266681E−02 |
| Y | 0.000000E+00 | 0.000000E+00 | 0.000000E+00 | 0.000000E+00 | 0.000000E+00 | 0.000000E+00 |
| X2 | −1.784786E−04 | −1.625398E−04 | −4.091759E−04 | −1.283213E−05 | 1.852188E−04 | 1.527974E−06 |
| Y2 | −1.924874E−04 | −2.007476E−04 | −4.089273E−04 | −3.385713E−05 | 1.462618E−04 | 1.999354E−06 |
| X2Y | 7.567253E−08 | 3.033726E−07 | 4.563127E−07 | 3.550829E−08 | 2.779793E−07 | 6.063643E−10 |
| Y3 | 4.318244E−08 | 4.548440E−09 | −4.162578E−08 | −2.113434E−08 | 6.705950E−07 | 5.861708E−09 |
| X4 | −4.430972E−10 | −1.014203E−09 | 4.055457E−09 | −6.220378E−11 | −8.891669E−10 | −1.395997E−11 |
| X2Y2 | −8.520546E−10 | −6.881264E−10 | 8.939911E−09 | −1.392199E−10 | 5.141975E−09 | −1.167067E−11 |
| Y4 | −4.543477E−10 | 9.382921E−10 | 5.474325E−09 | −6.995794E−11 | 5.400196E−10 | 3.206239E−12 |
| X4Y | −2.099305E−14 | −4.394241E−13 | −5.095787E−12 | −1.116149E−14 | −3.574353E−13 | 5.504390E−15 |
| X2Y3 | −9.594625E−14 | −5.563377E−12 | −2.467721E−12 | 1.007439E−14 | 1.351005E−11 | 1.988648E−14 |
| Y5 | −6.552756E−13 | −1.586808E−11 | 3.433129E−11 | 1.283373E−12 | 5.833169E−11 | 8.273816E−15 |
| X6 | −5.518407E−17 | −4.175604E−15 | −2.733992E−14 | −9.578075E−17 | −7.907746E−14 | −2.844119E−17 |
| X4Y2 | 1.982470E−16 | 5.202976E−15 | −3.722675E−14 | 1.225726E−16 | 2.278266E−14 | −2.154623E−17 |
| X2Y4 | 3.530434E−16 | 2.469563E−14 | −2.047537E−13 | −1.207944E−15 | 2.530016E−13 | 2.350448E−18 |
| Y6 | 1.142642E−15 | 2.708016E−14 | −7.131019E−34 | 1.880641E−14 | 1.622798E−13 | −9.962638E−18 |
| X6Y | −6.790512E−20 | −1.328271E−17 | −2.926272E−16 | −2.248097E−19 | −4.457988E−16 | 8.532237E−21 |
| X4Y3 | −6.322471E−19 | 3.908456E−17 | −2.737455E−16 | −7.629602E−20 | 1.416184E−15 | 3.243375E−20 |
| X2Y5 | −1.195858E−17 | −5.908420E−17 | 6.146576E−15 | 1.102606E−16 | 3.414825E−15 | −2.740056E−21 |
| Y7 | 2.350101E−17 | −1.477424E−15 | 5.232866E−14 | 1.218965E−15 | 1.819850E−15 | −1.903739E−19 |
| X8 | −6.917298E−22 | 8.248359E−20 | 6.770710E−19 | 9.667078E−22 | −3.953231E−39 | −4.407667E−23 |
| X6Y2 | −4.633739E−22 | 1.268409E−19 | −1.035701E−18 | −6.006155E−20 | 2.725218E−38 | −6.933821E−23 |
| X4Y4 | −1.497254E−20 | −1.719209E−18 | −3.217683E−18 | −1.742201E−20 | −1.679944E−39 | 4.964397E−23 |
| X2Y6 | −3.969941E−20 | −3.497307E−18 | 4.228227E−17 | −2.656234E−18 | 4.611895E−18 | 1.663632E−22 |
| Y8 | 6.708554E−20 | 1.187270E−18 | 2.685040E−38 | −1.611964E−39 | 4.730942E−18 | 6.011162E−23 |
| X8Y | −4.466562E−24 | 3.597751E−23 | 2.879249E−20 | −1.588496E−23 | −5.662885E−20 | 5.805689E−26 |
| X6Y3 | 2.874487E−23 | 1.003878E−20 | 6.793162E−20 | 3.438183E−23 | −1.071225E−20 | −1.310631E−25 |
| X4Y5 | 2.249612E−23 | 1.390470E−20 | 1.950655E−19 | 1.008316E−21 | −6.062162E−20 | −3.380438E−25 |
| X2Y7 | 5.258895E−22 | 2.194560E−20 | −2.724912E−18 | −3.405763E−20 | −1.780372E−19 | 1.649113E−25 |
| Y9 | −4.497858E−21 | 2.311634E−19 | −2.656603E−17 | −3.124398E−19 | −1.417439E−19 | 2.296226E−24 |
| X10 | 0.000000E+00 | −6.351950E−24 | −8.560053E−23 | −4.339912E−26 | −8.430614E−22 | −3.388610E−28 |
| X8Y2 | 0.000000E+00 | 4.523937E−24 | 9.792140E−22 | 2.952972E−24 | 9.614763E−23 | 1.083831E−27 |
| X6Y4 | 0.000000E+00 | −9.774541E−23 | −2.428620E−21 | −5.303412E−24 | −1.020095E−22 | 3.199302E−27 |
| X4Y6 | 0.000000E+00 | 4.704150E−23 | 1.195308E−42 | 2.279968E−23 | −6.658041E−23 | 1.968405E−27 |
| X2Y8 | 0.000000E+00 | 1.270549E−22 | 1.329832E−41 | 8.858543E−22 | 5.185397E−22 | 3.257732E−28 |
| Y10 | 0.000000E+00 | −1.244299E−21 | −8.254524E−44 | −6.003123E−22 | 5.204197E−23 | 1.473250E−27 |
| NRadius | 1.000000E+00 | 1.000000E+00 | 1.000000E+00 | 1.000000E+00 | 1.000000E+00 | 1.000000E+00 |

| Coefficient | M1 | M2 | M3 | M4 | M5 | M6 | Image |
|---|---|---|---|---|---|---|---|
| Y-Decentration | 37.685 | −15.713 | −139.004 | −151.477 | −395.184 | −440.921 | 0.000 |
| X-Rotation | 0.326 | −3.648 | −5.539 | −5.647 | 4.878 | 5.248 | 0.000 |

In FIG. 5, the reference numeral 18 denotes a chief ray which is allocated to a central object field point. The reference numeral 19 refers to a normal to the object plane 5 in FIG. 5, said normal passing through the central object field point. In other words, the chief ray 18 and the normal 19 intersect in the object plane 5. When the chief ray 18 continues to propagate along its path between the object plane 5 and the image plane 9, the distance of the chief ray 18 from the normal 19 increases monotonically. When the chief ray 18 passes through the image plane, in other words in the central image field point, this distance is identical to the object image shift $d_{OIS}$. As the distance of the chief ray 18 from the normal 19 increases monotonically along the beam path between the object plane 5 and the image plane 9, there will be no decrease in distance along the entire beam path. In the projection optics 16, this distance increases continuously until the chief ray 18 impinges upon the last mirror M6. Between the point of incidence of the chief ray 18 on the mirror M6 and the image plane 9, this distance remains constant.

Figure 6:
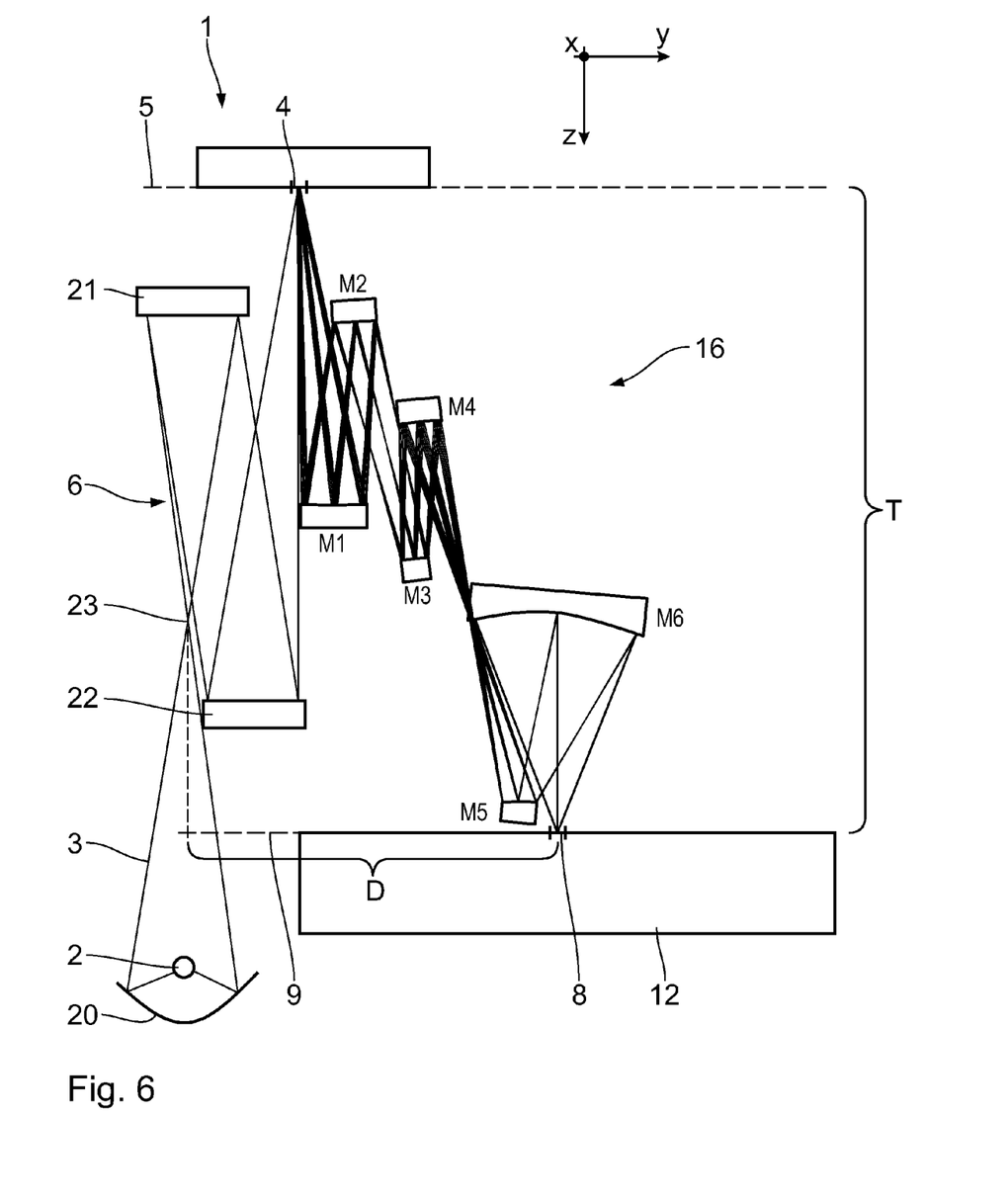
FIG. 6 show a diagrammatic view of a projection exposure apparatus including the projection objective shown in FIG. 5.

FIG. 6, which is less diagrammatic than FIG. 1, shows the projection exposure apparatus 1 which is equipped with the projection optics 16. Components, which correspond to those that have already been explained above in relation to FIGS. 1 to 5 in particular, have the same reference numerals and are not discussed in detail again.

Having been emitted by the light source 2, the illumination light 3 is initially collected by a collector 20 which is illustrated diagrammatically in FIG. 6.

In contrast to the illustration according to FIG. 1, the illustration according to FIG. 6 shows the light source 2 on a level which is below the level of the image plane 9 in FIG. 6. The illumination light 3 collected by the collector 20 therefore needs to be guided past the substrate holder 12.

In the embodiment according to FIG. 6, the illumination optics 6 includes a field facet mirror 21 which is disposed downstream of the collector 20, and a pupil facet mirror 22 which is disposed downstream of said field facet mirror 21. The two facet mirrors 21, 22 are used to achieve a defined setting of an intensity distribution and of an illumination angle distribution of the illumination light 3 across the object field 4. Between the collector 20 and the field facet mirror 21, there is an intermediate focus 23 which is disposed in the beam path of the illumination light 3. The large object image shift $d_{OIS}$ of the projection optics 16 according to FIGS. 5 and 6 allows the beam path to extend normally, in other words vertically, to the object plane 5 and to the image plane 9. Excessively large incidence angles on the mirrors guiding the illumination light 3 are therefore not required for guiding the illumination light 3 past the substrate holder 12.

The projection exposure apparatus 1 including the projection optics 16 according to FIG. 6 has an intermediate-focus image shift D of 855 mm. The intermediate-focus image shift D is defined as the distance of a central point of the image field 8 form a penetration point of a normal from the intermediate focus 23 to the image plane 9.

A ratio between the overall length T of the projection optics 16 and the intermediate-focus image shift D amounts to T/D=1.75 in the projection exposure apparatus 1 according to FIG. 6.

Figure 7:
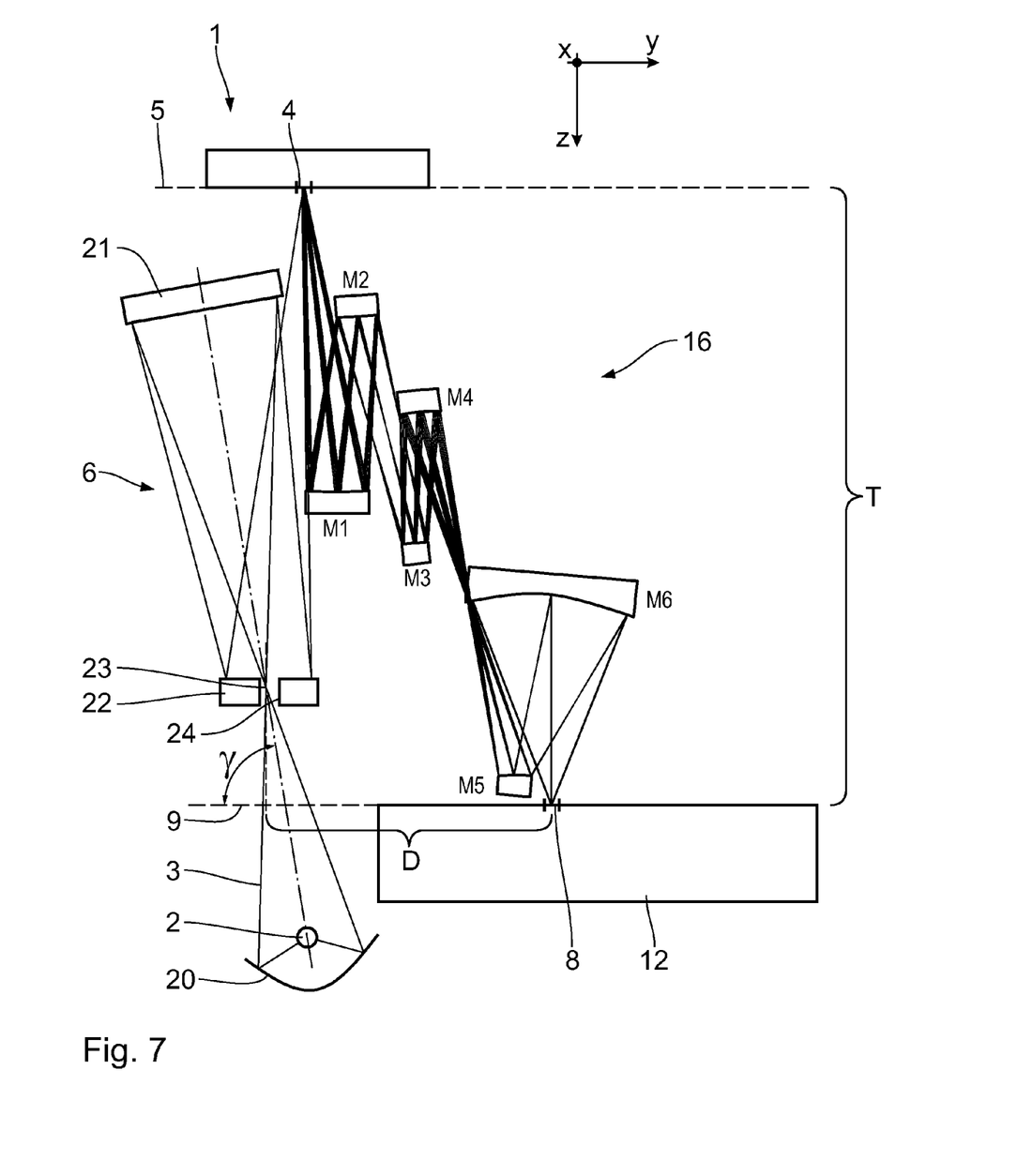
FIG. 7 shows a similar view to FIG. 6 of another embodiment of a projection exposure apparatus including the projection optics according to FIG. 5.

FIG. 7 is a similar illustration to FIG. 6 of a projection exposure apparatus 1 including the projection optics 16 according to FIG. 6 and including another embodiment of an illumination optics 6. Components which correspond to those that have already been explained above in relation to FIGS. 1 to 6, in particular to FIG. 6, have the same reference numerals and are not discussed in detail again.

In contrast to the illumination optics 6 of the embodiment according to FIG. 6, the embodiment according to FIG. 7 includes a pupil facet mirror 22 with a through opening 24 for the illumination light 3. The illumination light 3 passes through the through opening 24 along the beam path between the collector 20 and the field facet mirror 21. In the embodiment according to FIG. 7, the intermediate focus 23 is disposed in the vicinity of the through opening 24.

In the projection exposure apparatus 1 according to FIG. 7, an intermediate-focus image shift D amounts to 703 mm. Therefore, a ratio between the overall length T of the projection optics 16, which is identical to the projection optics 16 according to FIG. 6, and the intermediate-focus image shift D amounts to T/D=2.12.

The beam path between the collector 20 and the field facet mirror 21 makes an angle γ of 81° with the object plane 5 and with the image plane 9. Consequently, the beam path deviates from the normal by only 9°.

Using the illumination optics 6 according to FIG. 7, a particularly small maximum incidence angle of the illumination light 3 impinging upon the field facet mirror 21 is achieved.

The projection optical systems 7, 14, 15 and 16 are bundle-guiding components and therefore include only mirrors. These projection optical systems 7, 14, 15, 16 are therefore referred to as mirror projection objectives.

When producing a microstructured component using the projection exposure apparatus 1, the reflection mask 10 and the substrate 11 are provided in a first step. Afterwards, a structure on the reflection mask 10 is projected onto a light-sensitive layer on the wafer 11 using the projection optics 7, 14, 15 or 16 of the projection exposure apparatus 1. The light-sensitive layer is then developed into a microstructure on the wafer 11 which is then developed into the microstructured component.

Other embodiments are in the following claims.

What is claimed is:
1. An optical system, comprising:
   an illumination optics, comprising:
      a collector; and
      only two mirrors configured to guide light from the collector to illuminate an object field in an object plane; and
   a projection objective configured to image the object field into an image field in an image plane,
   wherein:
      the optical system is a microlithography optical system;
      the illumination optics is configured so that the light has an intermediate focus between a light source that generates the light and the object field;
      the intermediate focus is between the object plane and the image plane;

a ratio of an overall length of the projection objective to an intermediate-focus image shift is less than 2;
an object image shift of the projection objective is greater than 200 mm.

2. The optical system of claim 1, wherein the projection objective comprises at least six mirrors, at least one of the at least six mirrors has a freeform reflecting surface, and a ratio of the overall length of the projection objective to the object image shift is less than 12.

3. The optical system of claim 1, wherein the projection objective comprises at least six mirrors, at least one of the at least six mirrors has a freeform reflecting surface, and the image plane is a first field plane of the projection objective downstream of the object plane.

4. The optical system of claim 1, wherein the projection objective comprises a plurality of mirrors, and a ratio of the overall length of the projection objective to the object image shift is less than 2.

5. The optical system of claim 4, wherein the image plane is a first field plane of the projection objective downstream of the object plane.

6. The optical system of claim 1, wherein:
the projection objective comprises a plurality of mirrors;
at least one of the plurality of mirrors of the projection objective has a freeform reflecting surface;
the projection objective has at least one intermediate image plane between the object plane and the image plane; and
the ratio of the overall length of the projection objective to the object image shift is less than 12.

7. The optical system of claim 6, wherein the freeform reflecting surface is describable using the equation $$Z = \frac{cr^2}{1+\sqrt{1-(1+k)c^2r^2}} + \sum_{j=2}^{N} C_j X^m Y^n$$

wherein $$j = \frac{(m+n)^2 + m + 3n}{2} + 1$$

Z is a sagittal height of the freeform surface at the point x, y ($x^2+y^2=r^2$);
C is a constant which represents the apex curvature of a corresponding asphere;
k is a conical constant of a corresponding asphere; and
Cj are coefficients of the monomials $X^m Y^n$.

8. The optical system of claim 1, wherein:
a distance between a chief ray of a central object field point and a normal to the object plane increases monotonically along a path of the chief ray which starts at the object field and propagates to the image field; and
the normal to the object plane passes through the central object field point.

9. The optical system of claim 1, wherein the projection objective comprises at least six mirrors.

10. The optical system of claim 1, wherein:
the projection objective comprises a plurality of mirrors; and
a ratio of a difference between a largest and a smallest incidence angle of beams of the light impinging upon one of the plurality of mirrors of the projection objective to a numerical aperture on the image side of the projection objective is a maximum of 60°.

11. The optical system of claim 1, wherein an incidence angle of a beam of light allocated to a central object field point on the object field is between 5° and 9°.

12. The optical system of claim 1, further comprising the light source.

13. The optical system of claim 12, wherein the optical system is a microlithography projection exposure apparatus.

14. The optical system of claim 1, wherein the optical system is a microlithography projection exposure apparatus.

15. The optical system of claim 1, wherein the illumination system comprises mirrors.

16. The optical system of claim 15, wherein the optical system is a catoptric optical system.

17. The optical system of claim 1, wherein the optical system is a catoptric optical system.

18. The optical system of claim 1, wherein:
each mirror in the projection objective is positioned on the same side with respect to a normal to the object plane; and
the normal to the object plane passes through a central object field point on the object field.

19. The optical system of claim 1, wherein the ratio of the overall length of the projection objective to the intermediate-focus image shift is less than 1.9.

20. The optical system of claim 1, wherein the ratio of the overall length of the projection objective to the intermediate-focus image shift is less than 1.8.

21. The optical system of claim 1, wherein a ratio of the intermediate-focus image shift to the object image shift is between 1 and 2.

22. The optical system of claim 1, wherein a ratio of the intermediate-focus image shift to the object image shift is between 1 and 1.5.

23. The optical system of claim 1, wherein the only two mirrors are two facet mirrors.

24. A method of using an optical system which comprises an illumination system and a projection objective, the method comprising:
using the illumination system to illuminate a reticle in an object plane with light; and
using the projection objective to image the reticle onto a light-sensitive material in an image plane,
wherein:
the illumination optics comprises a collector and only two mirrors configured to guide the light from the collector to illuminate the reticle;
the illumination optics is configured so that the light has an intermediate focus between a light source that generates the light and the object field;
the intermediate focus is between the object plane and the image plane;
a ratio of an overall length of the projection objective to an intermediate-focus image shift is less than 2; and
an object image shift of the projection objective is greater than 200 mm.

25. The method of claim 24, wherein the light is EUV light.

26. The method of claim 24, wherein the ratio of the overall length of the projection objective to the intermediate-focus image shift is less than 1.9.

27. The method of claim 24, wherein the ratio of the overall length of the projection objective to the intermediate-focus image shift is less than 1.8.

28. The method of claim 24, wherein a ratio of the intermediate-focus image shift to the object image shift is between 1 and 2.

29. The method of claim 24, wherein a ratio of the intermediate-focus image shift to the object image shift is between 1 and 1.5.

30. The optical system of claim 24, wherein the only two mirrors are two facet mirrors.

* * * * *